United States Patent
Lee et al.

(10) Patent No.: US 9,000,794 B2
(45) Date of Patent: Apr. 7, 2015

(54) ELASTIC MICRO HIGH FREQUENCY PROBE

(75) Inventors: Yi-Lung Lee, Hsinchu Hsiang (TW); Chih-Chung Chen, Hsinchu Hsiang (TW); Tsung-Yi Chen, Hsinchu Hsiang (TW); Horng-Kuang Fan, Hsinchu Hsiang (TW)

(73) Assignee: MPI Corporation, Chu-Pei (TW)

( * ) Notice: Subject to any disclaimer, the term of this patent is extended or adjusted under 35 U.S.C. 154(b) by 315 days.

(21) Appl. No.: 13/477,056

(22) Filed: May 22, 2012

(65) Prior Publication Data
US 2012/0299612 A1   Nov. 29, 2012

(30) Foreign Application Priority Data
May 27, 2011   (TW) .............................. 100118745 A

(51) Int. Cl.
G01R 31/20 (2006.01)
G01R 1/067 (2006.01)

(52) U.S. Cl.
CPC .................................. *G01R 1/06772* (2013.01)

(58) Field of Classification Search
USPC ............................ 324/755.01, 755.07, 755.05
See application file for complete search history.

(56) References Cited

U.S. PATENT DOCUMENTS

| | | | | |
|---|---|---|---|---|
| 7,629,807 | B2* | 12/2009 | Hirakawa et al. | 324/755.07 |
| 2005/0007128 | A1* | 1/2005 | Beckous et al. | 324/754 |
| 2007/0080698 | A1* | 4/2007 | Cram | 324/761 |
| 2008/0143359 | A1* | 6/2008 | Gritters | 324/754 |
| 2010/0007365 | A1* | 1/2010 | Ishizuka et al. | 324/761 |
| 2010/0211013 | A1* | 8/2010 | Dillard, III | 604/164.08 |
| 2010/0244869 | A1* | 9/2010 | Uchida et al. | 324/754 |
| 2011/0025358 | A1* | 2/2011 | Kazama et al. | 324/755.01 |
| 2013/0049784 | A1* | 2/2013 | Hirano et al. | 324/755.01 |
| 2013/0249584 | A1* | 9/2013 | Lou et al. | 324/755.07 |
| 2014/0062518 | A1* | 3/2014 | Su | 324/755.01 |

* cited by examiner

*Primary Examiner* — Benjamin M Baldridge
(74) *Attorney, Agent, or Firm* — Ding Yu Tan

(57) ABSTRACT

An elastic micro high frequency probe includes a conductor, which includes a stationary body and a movable body. The stationary body has a conductive terminal, a contacting end, and a guider. The movable body has a conductive terminal, a spring mechanism, and a guider. The spring mechanism is connected to the stationary body and to one conductive terminal. The second guider connects to the spring mechanism in such a manner that the compression direction of the spring mechanism is confined by a guiding rail. Since the width of the spring mechanism is not limited by the first and second guiders, the width of the spring mechanism can be enlarged to maximize within limited space. Therefore, the HF probe as a whole can have shortest length while acquiring the predetermined total length of the elastic stroke, such that the transmission performance of the high frequency signals can be effectively enhanced.

12 Claims, 14 Drawing Sheets

ELASTIC MICRO HIGH FREQUENCY PROBE

FIELD OF THE INVENTION

The present invention relates to a vertical probing mechanism, and more specifically to an elastic micro high frequency ("high frequency" hereinafter is referred to as "HF") probe.

BACKGROUND

FIG. 1 shows a conventional vertical probing unit 1, which must include a spring mechanism 2 in order to perform elastic compression characteristics and to provide cushioning when a probe 3, which is connecting to one end of the spring mechanism 2, contacts to a pad 9 of a device under test (hereinafter referring to as "DUT"). In such a manner, a better contact performance between the probe 3 and the pad 9 can be achieved while preventing the probe 3 or the DUT from being damaged caused by an excessive contacting pressure.

FIG. 2 shows another conventional vertical probing unit 5 having a similar spring mechanism, but differing from the above-mentioned spring mechanism by including a first spring 6 and a second spring 7. An outer end of the first spring 6 is connecting to a probe 6a, and an outer end of the second spring 7 is connecting to a shaft 7a. In other words, the probe 6a and the shaft 7a of the vertical probing unit 5 are position changeable upon pressed, in order to be adapted for different usage environments. Such vertical probing unit can achieve the same performances as the above-mentioned probing unit 1.

Although the conventional probing units can fulfill the objective of the functional testing, there are still some drawbacks, especially when it comes to the transmission of HF signals, remained to be overcome. Generally speaking, a probing unit having good HF signal transmission performance enhances the precision and quality of DUT testing. However, those conventional probing units have the same or similar characteristic in that the spring mechanisms thereof are confined in a barrel having inner walls. As shown in FIG. 1, the spring mechanism 2 is located between two parallel side walls of a protective rod 4, while the first spring 6 and the second spring 7, as shown in FIG. 2, are located in the barrel 8. Thereby, the width W of the spring mechanisms is confined. This becomes disadvantageous since the performance of the probing unit is significantly affected when the size thereof becomes smaller and smaller. This is so because the protective rod 4 or the barrel 8 occupies relatively a small amount of space within a limited aperture of a jig. Moreover, the conventional elastic probe is movable only in the vertical direction. Such design is not suitable for use when requiring to laterally scrape the surface oxide layer off a planar pad of the DUT, and thus the contact resistance may become too large to undergo such type of testing procedures.

Therefore, our expectation is to enlarge the width of the spring mechanism to the maximum value under the constraining requirements of the limiting outer diameter D, i.e. the outer diameter of the protective rod or the barrel, and the restriction of the yield strength of the material, so as to achieve the best compression performance, i.e. the best working stroke, while shortening the total length of the spring mechanism. In such a manner, the inductance of the signal transmission can be lowered, so as to increase the bandwidth. Furthermore, it is desirable to control the movement of the spring through changes in structural design to meet the requirements of different DUTs. For example, if the tip of the probe can be configured to laterally scrape the surface oxide layer off the planar pad during testing, the contact resistance thereof can be more stable to achieve a better testing quality compared with the conventional elastic probe contacting the planar pad in a vertical-movement-only manner.

SUMMARY OF THE INVENTION

Therefore, an objective of the present invention is to provide an elastic micro HF probe, which has improved working stroke and enhanced transmission performance of the HF signals without enlarging the length of the spring mechanism.

To achieve the above and other objectives, the present invention provides an elastic micro HF probe including a conductor. The conductor has a first conductive terminal and a second conductive terminal. The micro HF probe is characterized in that the conductor includes a stationary body and a movable body. The stationary body includes the first conductive terminal, a contacting end, and a first guider formed between the first conductive terminal and the contacting end. The movable body includes the second conductive terminal, a spring mechanism, and a second guider. The second conductive terminal is located at an outside of the contacting end of the stationary body. The spring mechanism has one end connecting to the stationary body and an another end connecting to the second conductive terminal. The spring mechanism has a width wider than that of the first guider. The second guider connects to the spring mechanism and matches up with the first guider to confine a compression direction of the spring mechanism.

In one embodiment, the stationary body has an upper clamping plate and a lower clamping plate, and the upper and lower clamping plates connect to each other. There is a constant distance kept between the upper and lower clamping plates. At least one of the upper and lower clamping plates has a guiding rail defining the first guider. The stationary body has an end, at which the upper and lower clamping plates connect to each other, and the aforementioned end of the stationary body is formed with a through hole. The through hole has an inner wall defining the contacting end. The spring mechanism of the movable body is located between the upper and lower clamping plates, and the spring mechanism connects to a probing member which is penetrating through the through hole. The probing member has a distal end defining the second conductive terminal. The second guider comprises at least two guiding bosses connecting to the spring mechanism, and the guiding bosses are located at two sides of the guiding rail of the clamping plate.

In one embodiment, the spring mechanism of the movable body comprises a plurality of inter-connecting cantilevers, and the width of the spring mechanism defined as a distance between both ends of at least the cantilever adjacent to the guiding rail is wider than the width of the guiding rail of the clamping plate.

In one embodiment, the elastic micro HF probe further comprises at least one conductive plate. The conductive plate is disposed on a surface of one of the upper and lower clamping plates.

In one embodiment, the stationary body is a plate. The plate has a guiding groove defining the first guider. The spring mechanism of the movable body includes an upper spring and a lower spring located on two sides of the plate, respectively. The upper and lower springs inter-connect to a conductive shaft at their distal ends. The conductive shaft has a distal end defining the second conductive terminal.

In one embodiment, the guiding groove of the stationary body has a closed end and an open end. The guiding groove has an inner wall, which defines the contacting end, at the open end. The conductive shaft to which the distal ends of the upper and lower springs of the movable body connect penetrates through the open end of the guiding groove.

In one embodiment, the first guider is a winded shaft and a winded guiding groove.

The present invention further provides an elastic micro HF probe including a conductor. The conductor has a first conductive terminal and a second conductive terminal. The probe is characterized in that the conductor has a stationary body and a movable body. The stationary body includes a first contacting end, a second contacting end, and a first guider located between the first and second contacting ends. The movable body includes the first conductive terminal, the second conductive terminal, a spring mechanism, and a second guider. The spring mechanism has an end connecting to the first conductive terminal, which is located at an outside of the first contacting end of the stationary body, and an another end connecting to the second conductive terminal, which is located at an outside of the second contacting end of the stationary body. The second guider connects the spring mechanism and matches up with the first guider to confine a compression direction of the spring mechanism. Furthermore, the spring mechanism has a width larger than that of the first guider.

In one embodiment, the elastic micro HF probe comprises a separation element connecting to the stationary body and the movable body, and the first guider of the stationary body is divided into two parts by the separation element. The spring mechanism of the movable body is also divided into a first spring mechanism and a second spring mechanism by the separation element. The first spring mechanism is located in one part of the first guider, and the second spring mechanism is located in the other part of the first guider.

DETAILED DESCRIPTION

Figure 3:
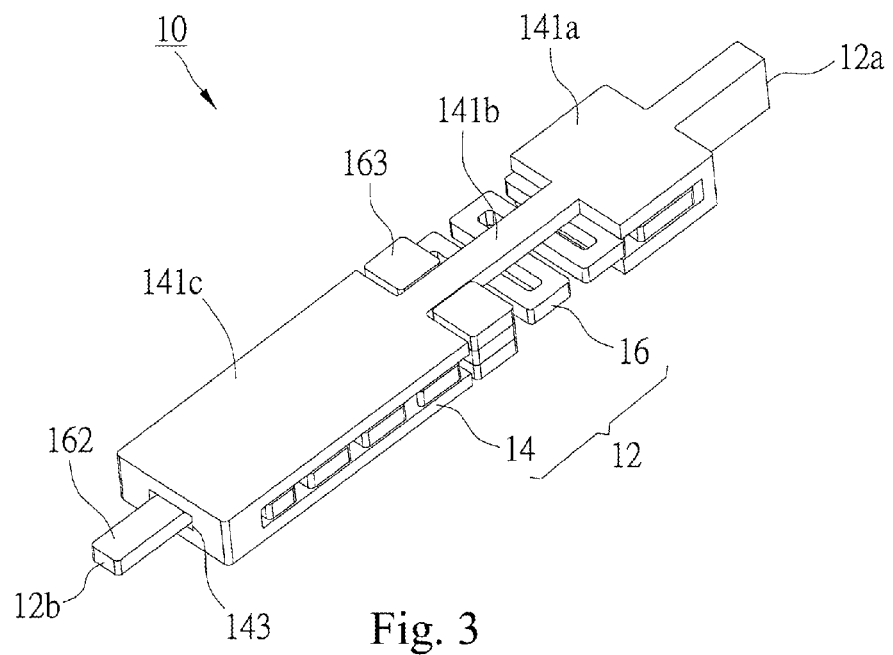
FIG. 3 is a perspective view of a HF probe of a first preferred embodiment of the present invention.
Figure 4:
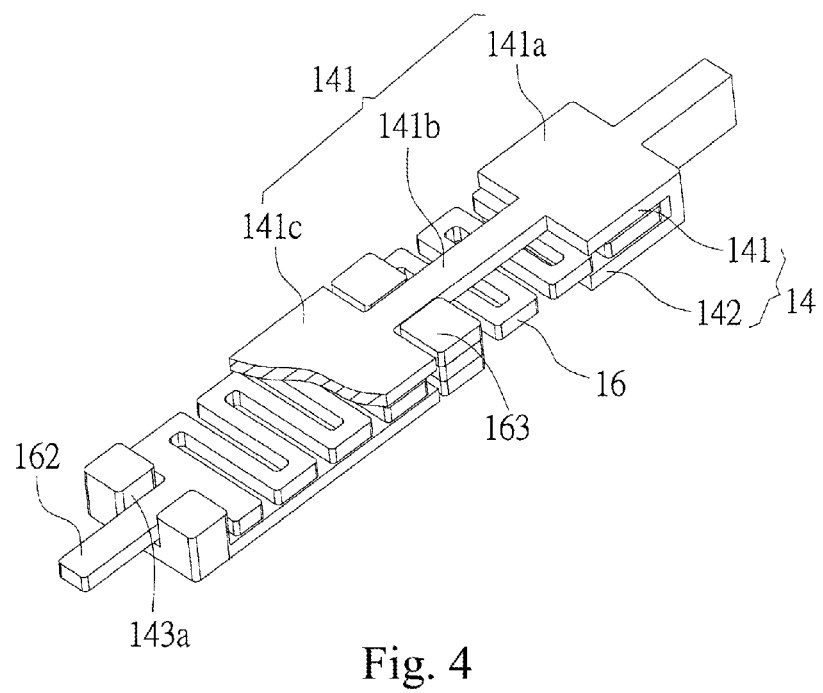
FIG. 4 is a partially-profiled perspective view of FIG. 3.
Figures 5, 6:
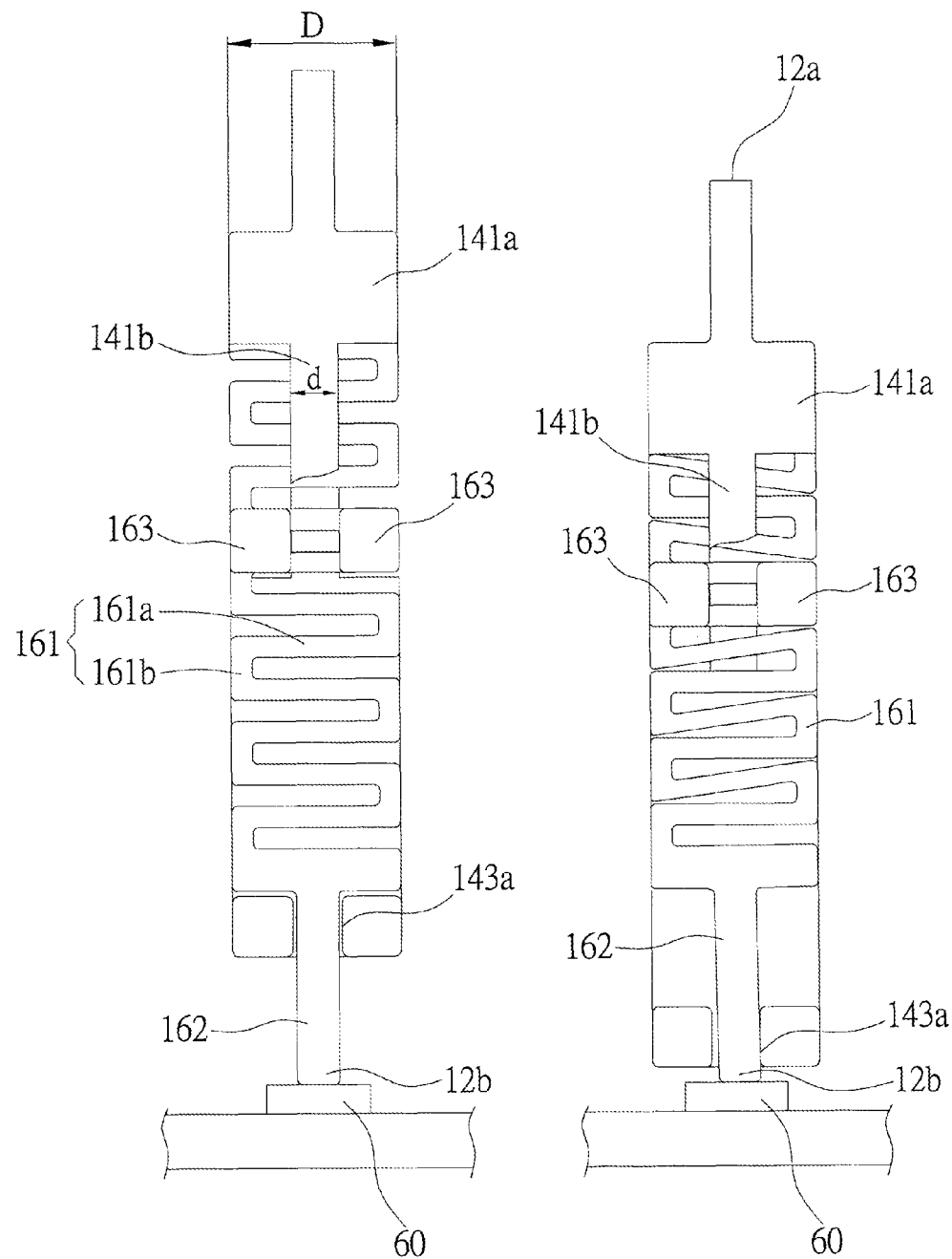
FIG. 5 is a lateral view illustrating a HF probe before compressed.
FIG. 6 is a lateral view illustrating a HF probe pressed against and contacting a DUT.

FIGS. 3-5 show an elastic micro HF probe 10, having an outer diameter D that is the same as that of the above-mentioned conventional probe, of a first preferred embodiment of the present invention. Under such dimensional requirement, the HF probe of the present embodiment has a conductor 12 adapted to transmit HF testing signals of a tester to a corresponding DUT. The conductor 12 is made by a lithography etching process to form a multi-layered structure having a stationary body 14 and a movable body 16. Since the lithography etching process is a known skill, it will not be illustrated in detail hereafter. The structure of the conductor 12, on the other hand, is described hereinafter, in which:

The stationary body 14 has an upper clamping plate 141 and a lower clamping plate 142 connecting to each other at their front and rear ends, and there is a constant distance therebetween. In the present invention, the upper and lower clamping plates have the same structural characteristics, and therefore, only the upper clamping plate 141 is being described as exemplification for the sake of convenience or brevity for illustration in this and the following embodiments.

The upper clamping plate 141 has a first wide portion 141a, a guiding rail 141b as exemplification of a first guider, and a second wide portion 141c connected in sequence. The guiding rail 141b has a width d. The stationary body 14 defines the conductive terminal 12a of the conductor 12 at the front end thereof where the upper and lower clamping plates connect to each other. The first conductive terminal 12a is used to electrically connect to a signal transmitting channel (not shown) of the tester. The stationary body 14 has a through hole 143 formed at the rear end thereof where the upper and lower clamping plates connect to each other, in which the through hole 143 is pre-made during the lithography etching process. The through hole 143 has an inner wall defining a contacting end 143a.

The movable body 16 has a spring mechanism elastically deformable between the upper clamping plate 141 and the lower clamping plate 142. The spring mechanism of the present embodiment is composed of several inter-connecting cantilevers 161, each of which is composed of a horizontal section 161a and a vertical section 161b. A distance D between two ends of the horizontal section 161a of the cantilever 161 is exactly the same as the outer diameter of the HF probe 10, and such distance D is bigger than the width d of the guiding rail 141b.

The spring mechanism has an end connecting to a position at close proximity to the front end of the stationary body 14, and another end of the spring mechanism integrally connecting to a probing member 162, which penetrating through the through hole 143 of the rear end of the stationary body 14. The probing member 162 has a distal end defining the second conductive terminal 12b of the conductor 12. As shown in FIG. 5, the second conductive terminal 12b is located at an outside of the stationary body 14 and thus is adapted to contact a DUT 60. In addition, the probing member 162 and the inner wall of the through hole 143 has only a small gap therebetween. In other words, as soon as there is a slight offset of the probing member 162 while the probing member 162 is pressed against the DUT 60, a side surface of the probing member 162 is prone to contact the inner wall of the through hole 143, which defines the contacting end 143a, so as to electrically connect the probing member 162 with the stationary body 14.

Furthermore, the movable body 16 has a second guider composed of two guiding bosses 163, which connect to the cantilever 161 and are located at two lateral sides of the guiding rail 141b of the stationary body 14, respectively. The guiding bosses 163 serve to prevent the spring mechanism from deformation in lateral directions upon being compressed, while the upper clamping plate 141 and the lower clamping plate 142 serve to prevent the spring mechanism from deformation in vertical directions. Thereby, the spring mechanism is well confined to undergo a stable compressing deformation, so as to control the slipping dynamic performance of the second conductive terminal 12b upon being pressed.

Figure 1:
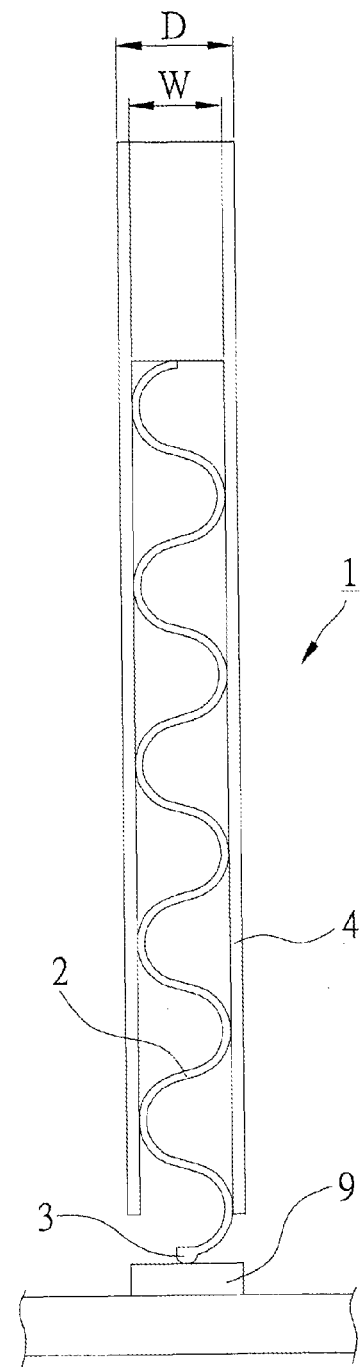
FIG. 1 is a diagram illustrating a conventional vertical probing unit.
Figure 2:
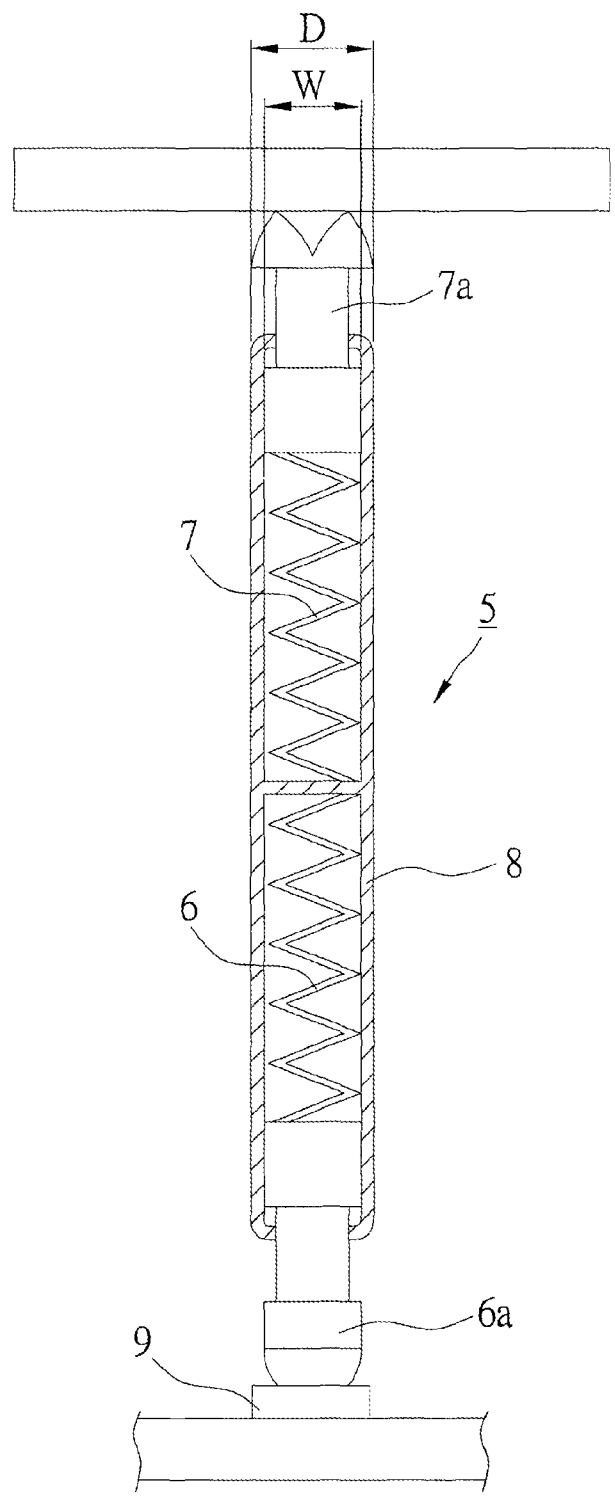
FIG. 2 is a diagram illustrating another conventional vertical probing unit.

In the above-mentioned structure, the movable body 16 of the HF probe 10 is properly confined, and each of the cantilevers 161 can perform the compressing deformation more easily. This is so because the horizontal section 161a of each cantilever 161 of the spring mechanism has a length that is the same as the outer diameter D of the barrel of the probing unit 1, 5 shown in FIG. 1 or FIG. 2. More specifically, upon having the limitation such that the biggest outer diameter of the HF probe 10 is required to be the same as that of the conventional probing unit 1,5, the spring mechanism of the present invention can, given shortened structural height, achieve the same compression space, i.e. same amount of compression as the predetermined compression amount of the probe of the conventional probing unit 1,5. In other words, a distance between the front and rear ends of the stationary body 14 can be reduced, and the total length of the HF probe 10 can be decreased as well.

When the probing member 162 of the HF probe 10 contacts the DUT 60 in such a manner that the probing member 162 is offset to abut against the inner wall of the through hole 143 of the stationary body 14 as shown in FIG. 6, the HF testing signals coming from the tester can be transmitted to the DUT 60 sequentially via the first conductive terminal 12a, the stationary body 14, and the second conductive terminal 12b, rather than through another route going through the movable body 16 including multiple cantilevers 161. This is so because the signals are selectively transmitted through a shorter route, although there are two signal transmission routes between the first conductive terminal 12a and the second conductive terminal 12b, in which one of the routes passes through the stationary body 14 and the other route passes through the movable body 16. In other words, the inductance of the HF probe 10 can be decreased while increasing the transmission bandwidth since the signal transmission route is shortened.

It is further noticeable that, by controlling the areas of the first wide portion 141a and the second wide portion 141c, the objective of tuning the impedance matching of the HF probe 10 can be achieved.

Figure 7:
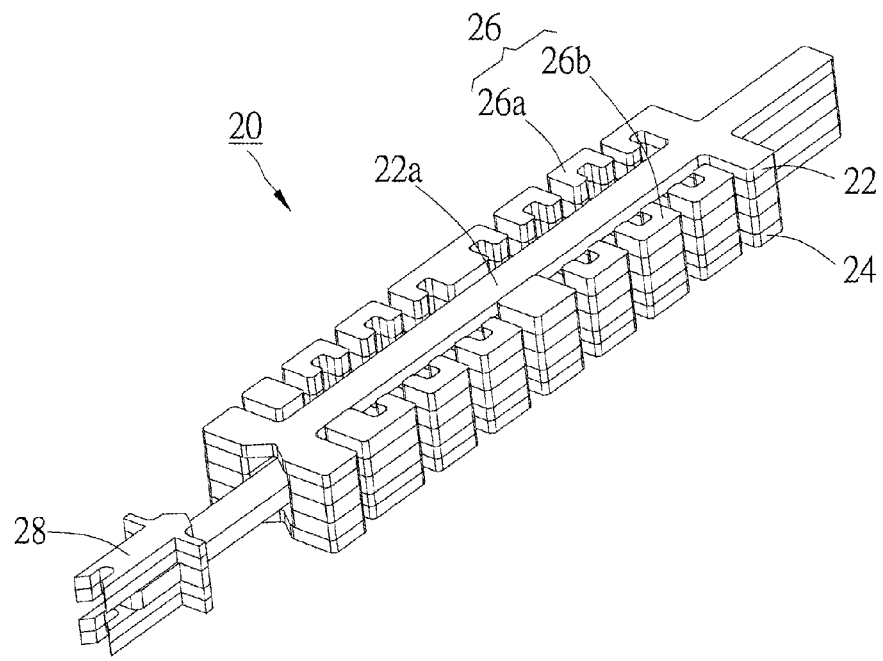
FIG. 7 is a perspective view of a HF probe of a second preferred embodiment of the present invention.
Figure 8:
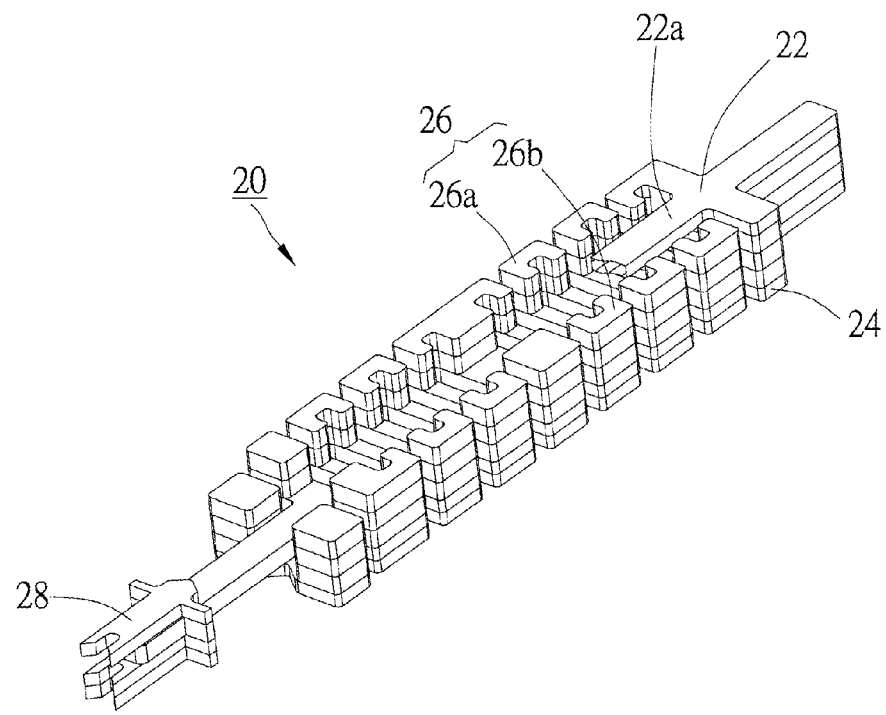
FIG. 8 is a partially-profiled perspective view of FIG. 7.

FIGS. 7-8 show an elastic micro HF probe 20 of a second preferred embodiment of the present invention, in which the probe has a similar multi-layered structure as that of the first preferred embodiment, i.e. having an upper clamping plate 22, a lower clamping plate 24, a spring mechanism 26, and a probing member 28, yet there are still differences found between the first and the second preferred embodiments, which are described as follow:

an extension length of the guiding rail of each clamping plate, e.g. the guiding rail 22a of the upper clamping plate 22 of the HF probe 20 of the second preferred embodiment is larger than that of the guiding rail 141b of the first preferred embodiment; the spring mechanism 26 is composed of a plurality of elastic members, and the spring mechanism 26 has a plurality of guiding bosses divided into several left guiding bosses 26a and several right guiding bosses 26b, in which each of the left and right guiding bosses 26a, 26b respectively connects to each of the corresponding cantilevers in a direction from the front end to the rear end of the clamping plates in such a manner that the guiding rail 22a is placed in between the left and right guiding bosses 26a, 26b, so as to achieve the objective of maintaining the compressing deformation stability of the spring mechanism 26.

Figure 9:
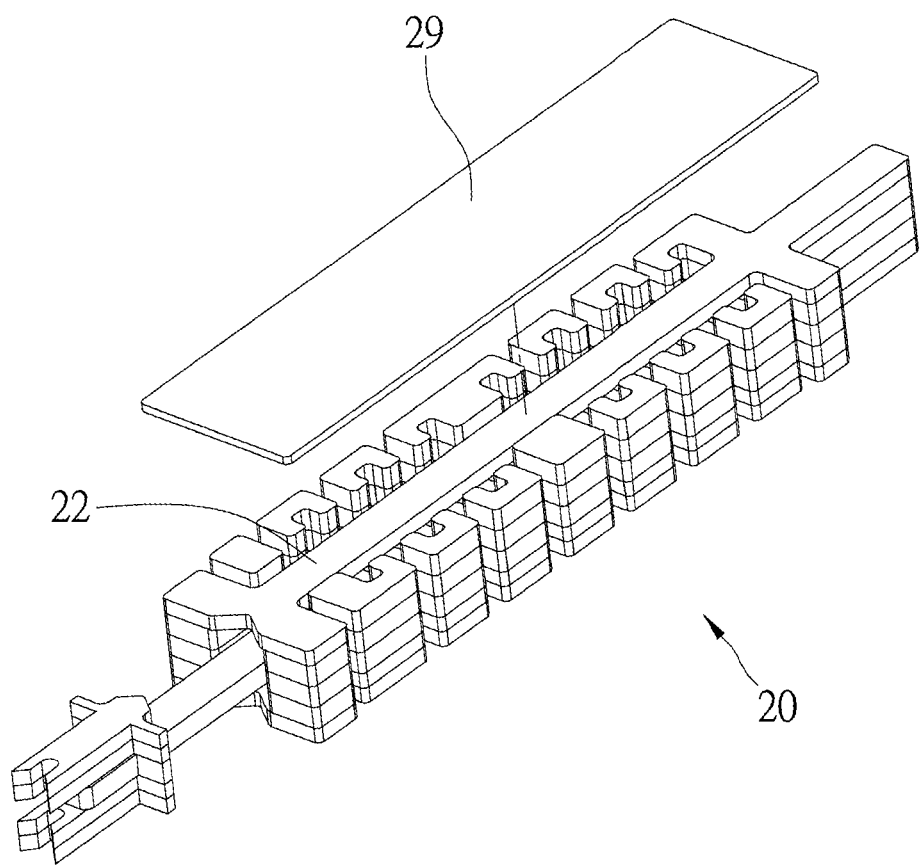
FIG. 9 is a perspective view of a HF probe of a third preferred embodiment of the present invention.

It is noticeable that, due to the placement of clamping plates of the stationary bodies of the above-mentioned embodiments at the outsides of the HF probes, the present invention can be further provided with at least one conductive plate attached to the surface of the clamping plate, and therefore achieve the objective of further increasing the transmission bandwidth by enlarging the signal transmission area. Alternatively, the area of the conductive plate can be changed to acquire a target impedance of the HF probe, so as to achieve impedance matching. Please refer to FIG. 9, which shows a third preferred embodiment based on the HF probe 20 of the second preferred embodiment, in which the surface of the upper clamping plate 22 is further attached with a conductive plate 29 without involving the compressing deformation ability of the spring mechanism. In the first preferred embodiment, the area of the first wide portion 141a and the second wide portion 141c is larger than that of the guiding rail 141b, such that the impedance can be matched by altering or modifying the area of the first wide portion 141a and the second wide portion 141c.

Figure 10:
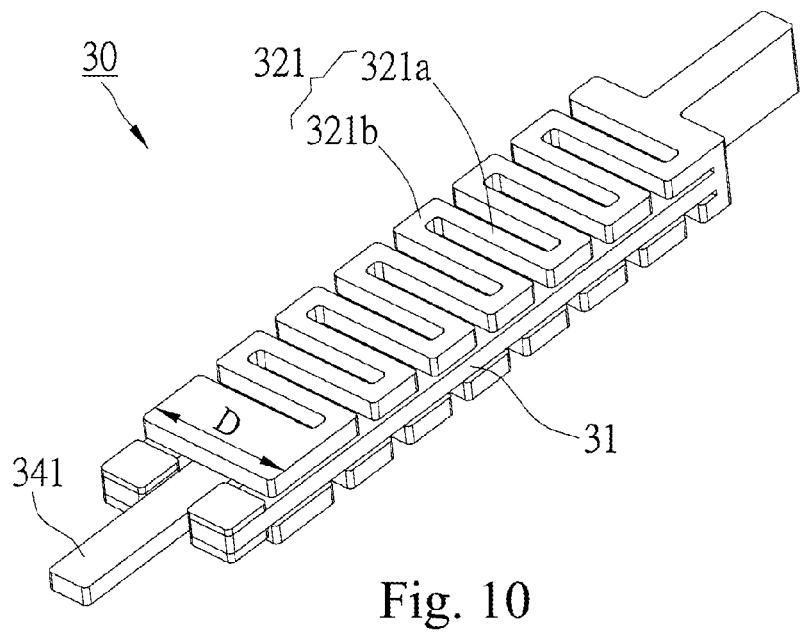
FIG. 10 is a perspective view of a HF probe of a fourth preferred embodiment of the present invention.
Figure 11:
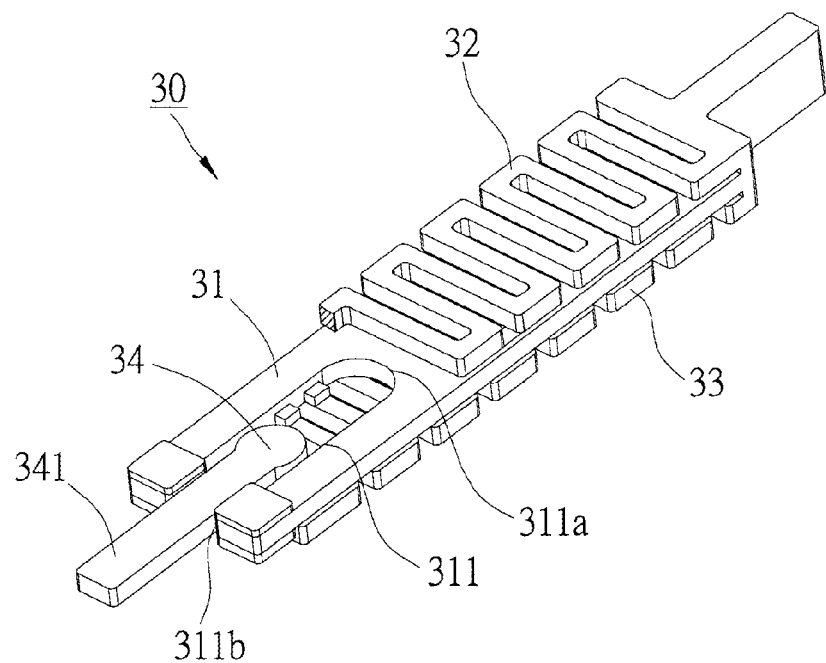
FIG. 11 is a partially-profiled perspective view of FIG. 10.

FIGS. 10-11 show an elastic micro HF probe 30 of a fourth embodiment of the present invention, which is still made by a lithography etching process. However, such HF probe 30 differs from those of the above-mentioned embodiments in the following manner:

The stationary body of the conductor of the present embodiment is a plate 31 having a guiding groove 311 defining the first guider. The guiding groove 311 of the present embodiment has a closed end 311a and an open end 311b, in which an inner wall of the open end 311b defines the contacting end. On the other hand, the plate 31 defines the first conductive terminal for electrically connecting to the signal transmission channel of the tester at an end thereof opposite to the contacting end. It should be emphasized that the guiding groove 311 is not necessarily provided with the open end, and that the guiding groove 311 can have an entirely closed aperture. In such instance, an inner wall of the closed guiding groove is exactly the contacting end.

The spring mechanism of the movable body of the conductor includes an upper spring 32 and a lower spring 33, which are located at two opposite side of the plate 31, respectively. Such springs 32, 33 can be deformed upon compressed without being affected by the plate 31. Since the upper and lower springs 32, 33 are structurally identical, it is only the upper spring 32 described hereinafter as exemplification for sake of brevity. The upper spring 32 is composed of multiple interconnecting cantilevers 321, each of which is composed of a horizontal section 321a and a vertical section 321b. Likewise, a distance D between both ends of the horizontal section 321a of the cantilever 321 is designed to be the largest outer diameter of the HF probe 30, and such distance D is larger than a width of the guiding groove 311.

The upper and lower springs 32, 33 inter-connect to a second guider composed of a guiding boss 34 at their ends. The guiding boss 34 further connects to a conductive shaft 341, which penetrates through the open end 311*b* of the guiding groove 311. The conductive shaft 341 has a distal end defining the second conductive terminal for contacting a DUT (not shown). The amount of space for the passage of the conductive shaft 341 is confined by the closed end 311*a* of the guiding groove 311. Likewise, the conductive shaft 341 can contact the DUT in a manner that the conductive shaft 341 is offset to contact the inner wall, i.e. the contacting end, of the open end 311*b* of the guiding groove 311, such that the conductive shaft 341 electrically connects to the plate 31 to form the shortest transmission route so as to achieve the objective of reducing the inductance of the conductor while enhancing the HF signal transmission performance.

Figure 12:
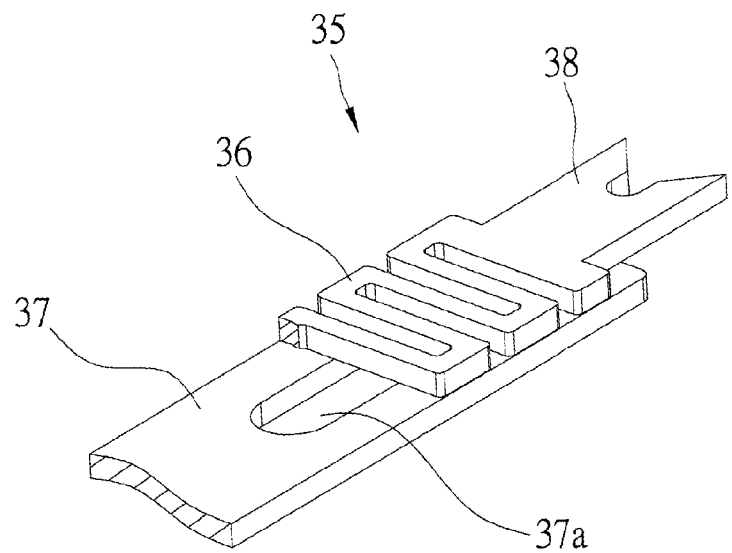
FIG. 12 is a perspective view of a HF probe of a fifth preferred embodiment of the present invention.
Figure 13:
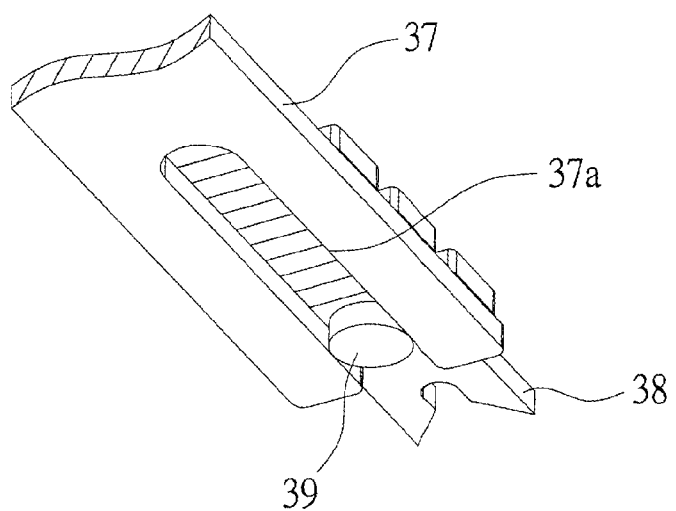
FIG. 13 is a bottom view of FIG. 12.

FIGS. 12-13 show an elastic micro HF probe of a fifth preferred embodiment of the present invention, which has a structure and characteristics similar to those of the fourth preferred embodiment, but differs in the following manner: the HF probe 35 of the fifth preferred embodiment has only one spring mechanism 36 attached to the plate 37, and the spring mechanism 36 has one end connecting to a conductive shaft 38. The conductive shaft 38 has a bottom thereof provided with a guiding boss 39 defining the second guider, which is movable along a guiding groove 37*a*, i.e. the first guider, of the plate 37. Likewise, a guiding groove 37*a* does not necessarily have an open end. The advantage of such structural design lies in the simplicity of the combined parts.

Figure 14:
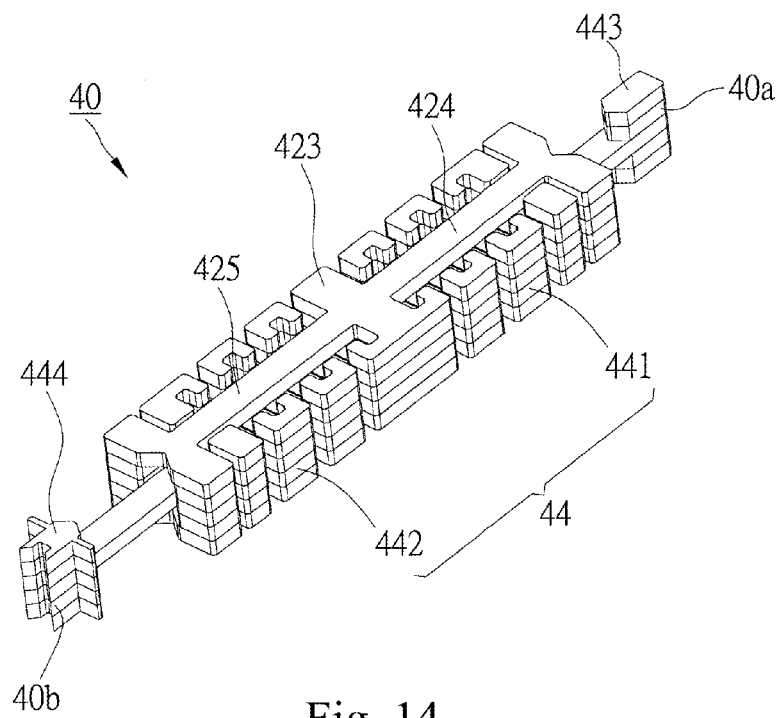
FIG. 14 is a perspective view of a HF probe of a sixth preferred embodiment of the present invention.
Figure 15:
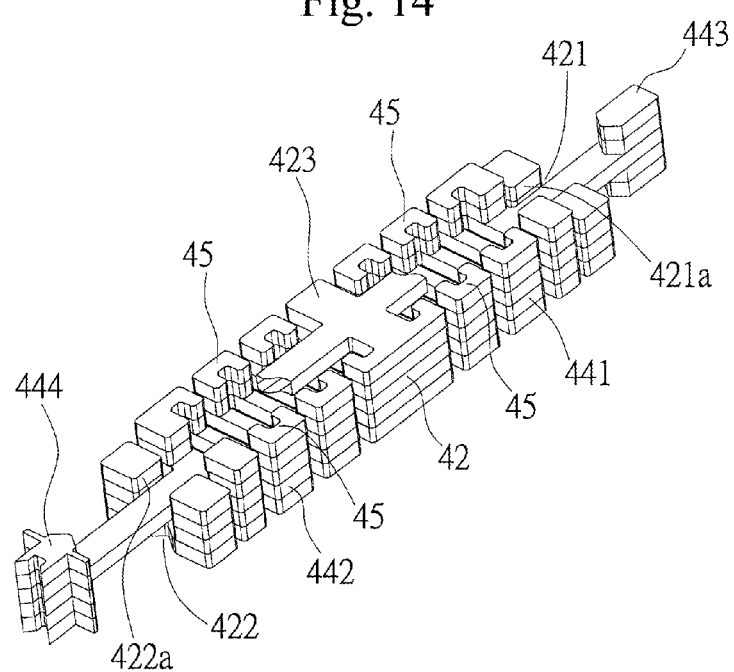
FIG. 15 is a partially-profiled perspective view of FIG. 14.

FIGS. 14-15 show an elastic micro HF probe 40 of a sixth preferred embodiment of the present invention, which has a structure differing from the above embodiments having only one compression-responsive movable conductive terminal. That is to say, both the first conductive terminal 40*a* and the second conductive terminal 40*b* of the HF probe are position changeable in responsive to the compression. To achieve the above-mentioned objective, the conductor of the HF probe 40 is modified based on the structure shown in FIG. 7. More specifically, the HF probe 40 has a stationary body 42 composed of inter-connecting upper and lower clamping plates. Both ends of the stationary body 42 are formed of a first through hole 421 and a second through hole 422, respectively, in which the through holes 421, 422 have inner walls defining a first contacting end 421*a* and a second contacting end 422*a*, respectively. There is also one separation element 423 located at a middle portion of the upper and lower clamping plates to separate a longitudinal-shaft-shaped first guiding rail 424, i.e. the first guider, formed between the first contacting end 421*a* and the separation element 423, from a longitudinal-shaft-shaped second guiding rail 425, i.e. the other first guider, formed between the second contacting end 422*a* and the separation element 423.

A movable body 44 of the HF probe 40 includes a first spring mechanism 441, a second spring mechanism 442, a shaft 443, and a probing member 444. The first spring mechanism 441 and the second spring mechanism 442 are composed of several cantilevers respectively, and each of the spring mechanisms has one end connecting to the separation element 423. A distance between both ends of a horizontal section of each cantilever is exactly the same as the largest outer diameter of the HF probe 40 and is larger than a width of each guiding rail. It is noticeable that each spring mechanism is not necessarily provided with an end connecting to the separation element 423. Rather, the end of each spring mechanism can be designed to be slidably contact with the separation element 423. The first spring mechanism 441 has another end thereof connecting to the shaft 443, which penetrates through the first through hole 421 and has a distal end thereof defining the first conductive terminal 40*a*. The second spring mechanism 442, on the other hand, has another end thereof connecting to the probing member 444, which penetrates through the second through hole 422 and has a distal end thereof defining the second conductive terminal 40*b*. The first conductive terminal 40*a* is adapted to electrically connect to a signal transmission channel of a tester, while the second conductive terminal 40*b* is adapted to contact a DUT (not shown).

Likewise, the HF probe 40 has at least two guiding bosses 45, i.e. the second guider, disposed on the cantilevers of each spring mechanism for placing each guiding rail in between, so as to prevent the spring mechanisms from, upon pressed, lateral deformation. The shaft 443 and the probing member 444 of the HF probe 40 are used to respectively bear or endure against the pressure coming from both sides, such that they can be offset to contact the first contacting end 421*a* and the second contacting end 422*a*, and thus the shortest transmission route can be formed to enhance the HF signal transmission performance.

It is noticeable that it is not necessary to provide two separate spring mechanisms, i.e. the first and the second spring mechanisms as shown in FIG. 14, to make both conductive terminals movable upon pressed. Such separate-spring-mechanisms design can be reduced into one single spring mechanism having two ends each defining a conductive terminal, while the separation element of the stationary body is correspondingly eliminated. In such a manner, both of the conductive terminals can be movable when that single spring mechanism bears against or subjected to the forces coming from both sides.

Figure 16:
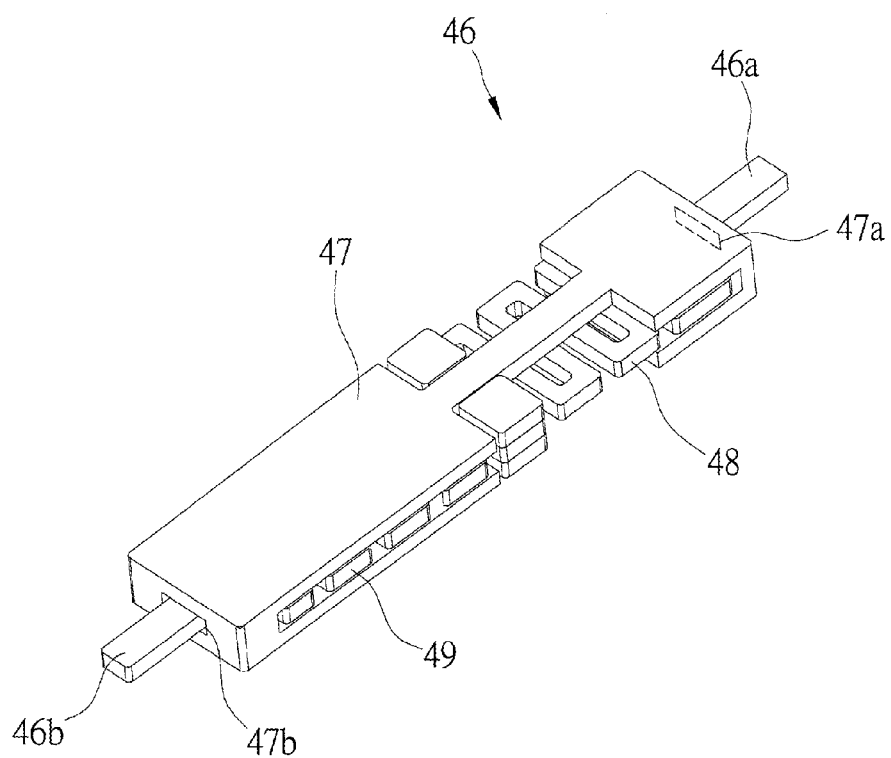
FIG. 16 is a perspective view of a HF probe of a seventh preferred embodiment of the present invention.

FIG. 16 shows an elastic micro HF probe 46 of a seventh preferred embodiment of the present invention. The HF probe 46, likewise, has a first conductive terminal 46*a* and a second conductive terminal 46*b*, which are both movable upon pressed. The structure of the HF probe 46 is modified from that as shown in FIG. 3. More specifically, the HF probe 46 also has a stationary body 47 composed of inter-connecting upper and lower clamping plates. Both ends of the stationary body 47 are formed with a through hole 47*a* and a through hole 47*b*, respectively. In addition, the HF probe 46 has a first spring mechanism 48 and a second spring mechanism 49 disposed in the stationary body 47. The first spring mechanism 48 has one end penetrating through the through hole 47*a* and defining the first conductive terminal 46*a* at its distal end. The second spring mechanism 49 has one end penetrating through the through hole 47*b* and defining the second conductive terminal 46*b* at its distal end.

Figure 17:
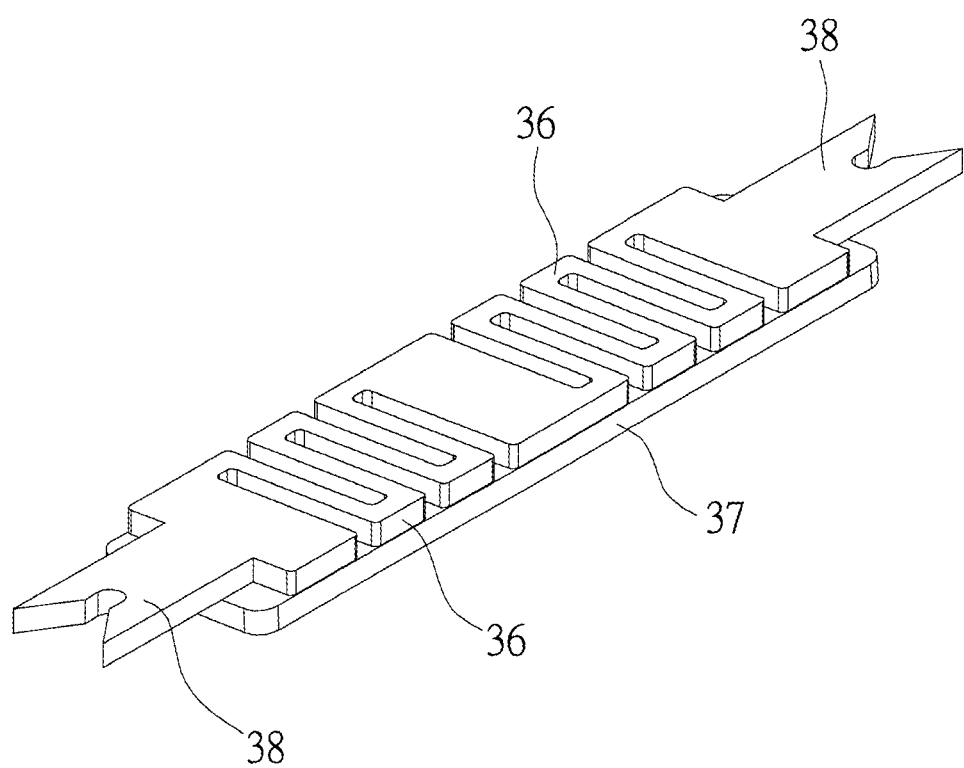
FIG. 17 is a perspective view of a HF probe of an eighth preferred embodiment of the present invention.

It is further noticeable that, besides the structures shown in FIGS. 14 and 16, the HF probe as shown in FIG. 12 can also be modified to include two movable conducive terminals, such as shown in FIG. 17 illustrating an eighth preferred embodiment of the present invention. In addition, those HF probes 40 and 46 can be attached with a conductive plate (not shown) at a surface of one of the upper and lower clamping plates to increase the transmission bandwidth.

Figure 18:
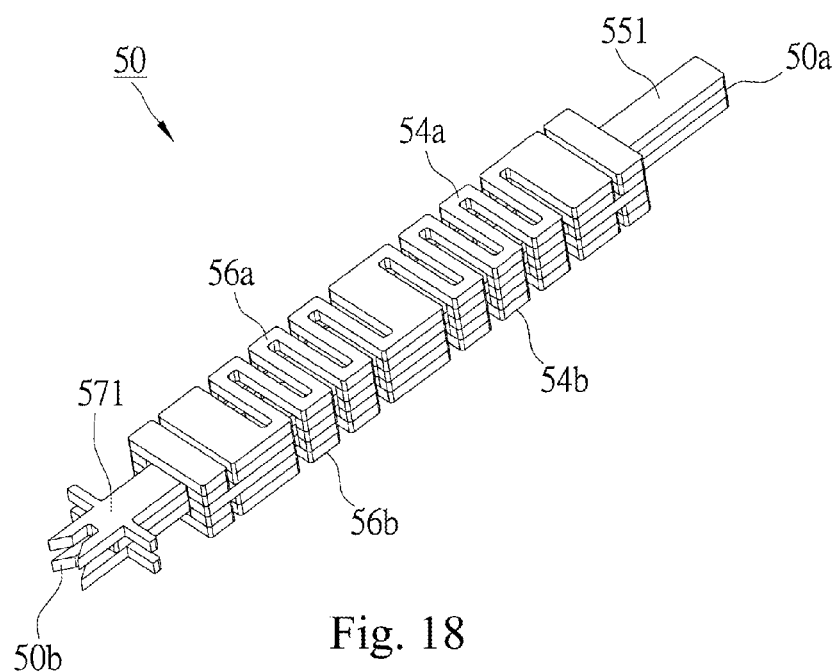
FIG. 18 is a perspective view of a HF probe of a ninth preferred embodiment of the present invention.
Figure 19:
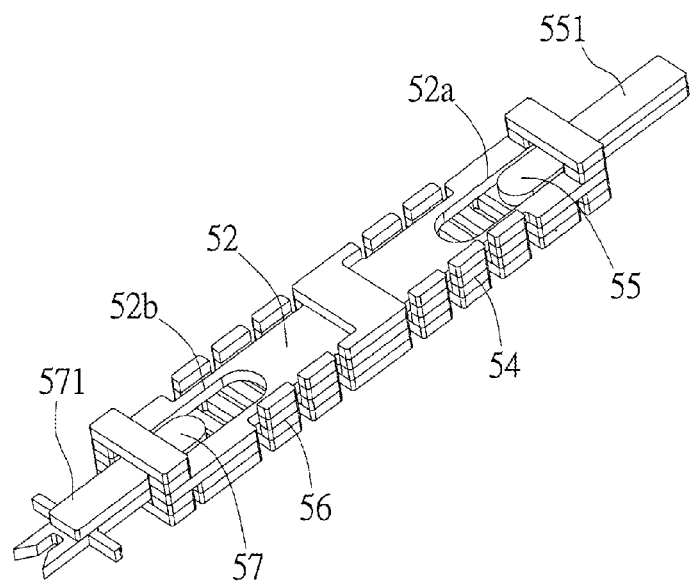
FIG. 19 is a partially-profiled perspective view of FIG. 18.

FIGS. 18 and 19 show an elastic micro HF probe 50 of the ninth preferred embodiment of the present invention. The HF probe 50 also has a first conductive terminal 50*a* and a second conductive terminal 50*b*, both are movable upon pressed. Such HF probe 50 is modified from the structure as shown in FIG. 10. The stationary body of the HF probe 50 is still a plate 52, and the plate 52 has a first guiding groove 52*a* defining the first guider and a second guiding groove 52*b* defining the other first guider. Each guiding groove 52*a*, 52*b* has an inner wall defining the contacting end. A movable body has a first spring mechanism 54 and a second spring mechanism 56 composed of an upper spring 54*a*, 56*a* and a lower spring 54*b*, 56*b* located on both sides of the plate 52, respectively. The upper and lower springs 54a and 54b of the first spring mechanism 54 connect to a guiding boss 55 defining the second guider. The guiding boss 55 further connects to a shaft 551, which is movable with respect to the first guiding groove 52a and has a distal end defining the first conductive terminal 50a. The upper and lower springs 56a and 56b of the second spring mechanism 56 also connect to a guiding boss 57 defining the other second guider. The guiding boss 57 further connects to a probing member 571, which is movable with respect to the second guiding groove 52b and has a distal end defining the second conductive terminal 50b. Likewise, the probing member 571, the plate 52 and the shaft 551 cooperatively together define the shortest transmission route to increase the HF signal transmission performance when the shaft 551 and the probing member 571 contact the respective guiding grooves.

It is noticeable that, those above-mentioned HF probes including the first and second spring mechanisms or the upper and lower springs can be provided with or without a connecting element connecting the spring mechanisms. In the prior manner, the spring mechanisms are connected together. In the later manner, the spring mechanisms are independent from each other.

Figure 20:
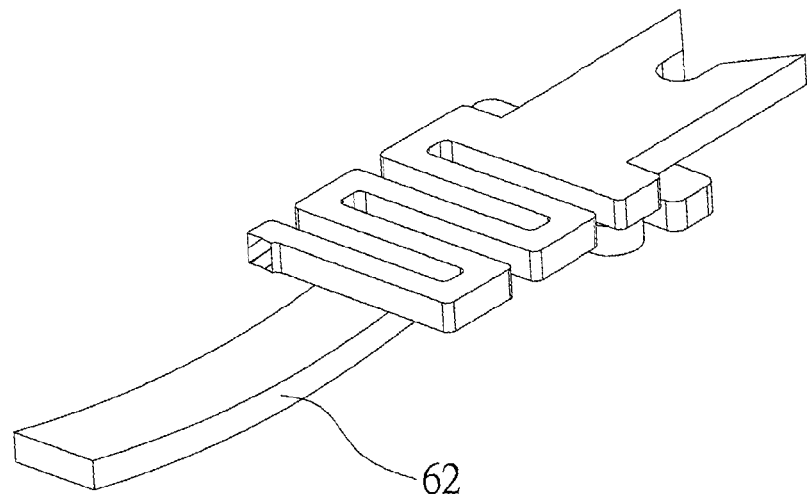
FIG. 20 is a perspective view illustrating a winded shaft as exemplify of a guiding rail.
Figure 21:
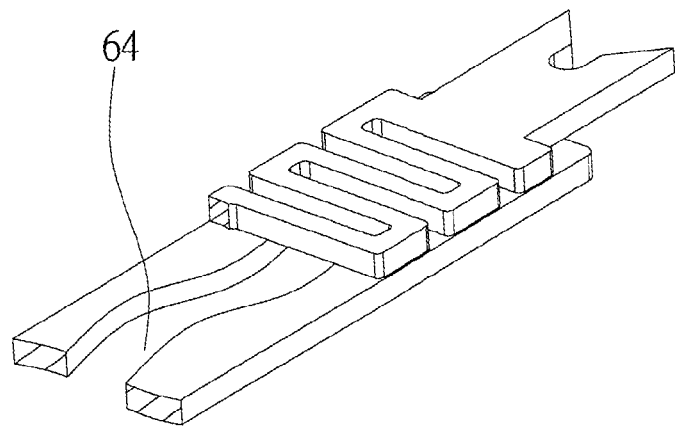
FIG. 21 is a perspective view illustrating a winded guiding groove as exemplify of a guiding rail.

There are two types of the first guiders in the above-mentioned embodiments, one of which is the longitudinal-shaft-shaped guiding rail as shown in FIGS. 3, 7, 14 and 16, and the other of which is the guiding groove structure as shown in FIGS. 11, 12, 17 and 19. There are, of course, two types of the second guiders to correspond to the first guiders, one of which is the guiding boss as shown in FIGS. 3, 7, 14 and 16, and the other of which is the guiding boss as shown in FIGS. 11, 12, 17 and 19. In order to scrape the surface oxide layer off the DUT by the tip of the HF probe and to decrease the contacting impedance when the HF probe contacts the DUT, the first guider of the present invention can be further modified to be a winded shaft 62 as shown in FIG. 20 or a winded guiding groove 64 as shown in FIG. 21. The probing member of the HF probe can thus laterally scrape the oxide layer off to decrease the contacting impedance with the help of the non-linear guiding path.

It is to be supplemented that there can be multiple probing members, rather than just one as shown in the above-mentioned embodiments, to contact the DUT depending on the requirements, and the probing member can be sheet-like. Furthermore, the amounts or number of the guiding rail and the guiding boss can be varied in corresponding to the length of the spring mechanism.

Figure 22:
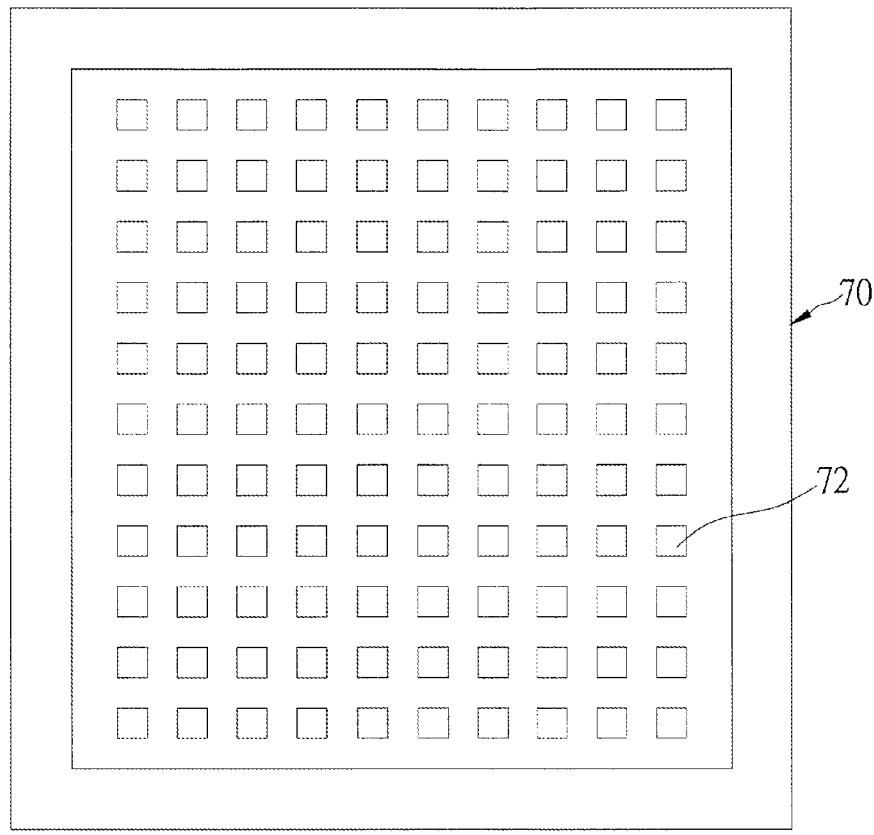
FIG. 22 is a planar view illustrating a guiding plate with rectangular-shaped guiding bores.

Finally, the HF probes of the above-mentioned embodiments are vertically disposed when in use. A guiding plate 70, adapted to support the HF probes, has multiple guiding bores 72, each of which is preferably rectangular as shown in FIG. 22. This is so because the cross-section of the above-mentioned HF probes is also rectangular. In such a manner, the HF probes can be vertically moved steadily.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An elastic micro high frequency probe, comprising:
   a conductor, the conductor comprising:
      a stationary body, comprising a first conductive terminal, a contacting end, and a first guider formed between the first conductive terminal and the contacting end; and
      a movable body, comprising a second conductive terminal, a spring mechanism, and a second guider,
      wherein the second conductive terminal is located at an outside of the contacting end of the stationary body, the spring mechanism has an end thereof connecting to the stationary body and another end thereof integrally connecting to the second conductive terminal, the spring mechanism has a width wider than that of the first guider, the second guider connects to the spring mechanism and matches up with the first guider to confine a compression direction of the spring mechanism;
      the stationary body has an upper clamping plate and a lower clamping plate, the upper and lower clamping plates connect to each other, and there is a constant distance between the upper and lower clamping plates, at least one of the upper and lower clamping plates has a guiding rail defining the first guider, the stationary body has an end, at which the upper and lower clamping plates connect to each other, said end of the stationary body is formed with a through hole, the through hole has an inner wall defining the contacting end; the spring mechanism of the movable body is located between the upper and lower clamping plates, and the spring mechanism connects to a probing member penetrating through the through hole, the probing member has a distal end defining the second conductive terminal, the second guider comprises at least two guiding bosses connecting to the spring mechanism, and the guiding bosses are located at two sides of the guiding rail of the clamping plate.

2. The elastic micro high frequency probe of claim 1, wherein the spring mechanism of the movable body comprises a plurality of inter-connecting cantilevers, and the width of the spring mechanism defined as a distance between both ends of at least the cantilever adjacent to the guiding rail is wider than the width of the guiding rail of the clamping plate.

3. The elastic micro high frequency probe of claim 1, further comprising at least one conductive plate, wherein the conductive plate is disposed on a surface of one of the upper and lower clamping plates.

4. The elastic micro high frequency probe of claim 1, wherein the first guider is a winded shaft.

5. The elastic micro high frequency probe of claim 1, wherein the first guider is a winded guiding groove.

6. The elastic micro high frequency probe of claim 1, wherein the spring mechanism of the movable body is composed of a plurality of elastic members.

7. An elastic micro high frequency probe, comprising:
   a conductor, the conductor comprising:
      a stationary body, comprising a first conductive terminal, a contacting end, and a first guider formed between the first conductive terminal and the contacting end; and
      a movable body, comprising a second conductive terminal, a spring mechanism, and a second guider,
      wherein the second conductive terminal is located at an outside of the contacting end of the stationary body, the spring mechanism has an end thereof connecting to the stationary body and another end thereof integrally connecting to the second conductive terminal, the spring mechanism has a width wider than that of the first guider, the second guider connects to the spring mechanism and matches up with the first guider to confine a compression direction of the spring mechanism;

the stationary body is a plate, which has a guiding groove defining the first guider; the spring mechanism of the movable body comprises an upper spring and a lower spring located on two sides of the plate respectively, the upper and lower springs have distal ends thereof inter-connecting to a guiding boss defining the second guider, the second guider further connects to a conductive shaft, the conductive shaft has a distal end defining the second conductive terminal.

8. The elastic micro high frequency probe of claim 7, wherein the guiding groove of the stationary body has a closed end and an open end, the guiding groove has an inner wall at the open end defining the contacting end; the conductive shaft to which the distal ends of the upper and lower springs of the movable body are connected penetrates through the open end of the guiding groove.

9. The elastic micro high frequency probe of claim 7, wherein the spring mechanism of the movable body comprises a plurality of inter-connecting cantilevers, the width of the spring mechanism defined as a distance between both ends of at least the cantilever adjacent to the guiding groove is wider than a width of the guiding groove.

10. The elastic micro high frequency probe of claim 7, wherein the first guider is a winded shaft.

11. The elastic micro high frequency probe of claim 7, wherein the first guider is a winded guiding groove.

12. The elastic micro high frequency probe of claim 7, wherein the spring mechanism of the movable body is composed of a plurality of elastic members.

\* \* \* \* \*